(12) United States Patent
Miyake et al.

(10) Patent No.: US 7,193,431 B2
(45) Date of Patent: Mar. 20, 2007

(54) RESISTANCE COMPENSATION METHOD, CIRCUIT HAVING A RESISTANCE COMPENSATION FUNCTION, AND CIRCUIT RESISTANCE TEST METHOD

(75) Inventors: Hiroshi Miyake, Kawasaki (JP); Noriyuki Tokuhiro, Kawasaki (JP); Tadao Aikawa, Kawasaki (JP); Hiroshi Miyazaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 106 days.

(21) Appl. No.: 11/017,880

(22) Filed: Dec. 22, 2004

(65) Prior Publication Data

US 2006/0044008 A1 Mar. 2, 2006

(30) Foreign Application Priority Data

Aug. 30, 2004 (JP) ............................. 2004-250781

(51) Int. Cl.
*H03K 17/16* (2006.01)
*H03K 19/003* (2006.01)

(52) U.S. Cl. ...................... 326/30; 326/27; 323/17.3; 323/32; 324/601

(58) Field of Classification Search ............ 326/26–27, 326/30; 323/17.3, 32; 324/601
See application file for complete search history.

(56) References Cited

U.S. PATENT DOCUMENTS 6,429,679 B1 * 8/2002 Kim et al. .................... 326/30
6,541,996 B1 * 4/2003 Rosefield et al. ............. 326/30
6,605,958 B2 8/2003 Bergman et al.

FOREIGN PATENT DOCUMENTS

JP 10-133792 5/1998
JP 2002-199030 7/2002

* cited by examiner

*Primary Examiner*—Rexford Barnie
*Assistant Examiner*—Jason Crawford
(74) *Attorney, Agent, or Firm*—Arent Fox LLP.

(57) ABSTRACT

A method for compensating for semiconductor device resistance is disclosed that includes the step of realizing a resistance equal to a desired resistance by one of combinations of multiple semiconductor devices. This step includes the step of sequentially selecting two or more of the semiconductor devices to be combined, and thereby sequentially changing a resistance realized by the selected two or more of the semiconductor devices to be combined.

15 Claims, 12 Drawing Sheets

RESISTANCE COMPENSATION METHOD, CIRCUIT HAVING A RESISTANCE COMPENSATION FUNCTION, AND CIRCUIT RESISTANCE TEST METHOD

BACKGROUND OF THE INVENTION

1. Field of the Invention

The present invention relates to a resistance compensation method, a circuit having a resistance compensation function, and a circuit resistance test method.

2. Description of the Related Art

In an LSI circuit required in design to perform high-speed data transfer, such as a so-called DDR2 (Double Data Rate 2) memory interface, the termination resistance of the interface part with a memory circuit is adjusted and controlled. In the case of the DDR2 memory interface, the inclusion of a so-called ODT (On Die Termination) function is specified in order to adjust the termination resistance of the interface part between the memory circuit and the LSI circuit. Therefore, for instance, in the ODT circuit of the DDR2 memory interface, it is necessary to include a mechanism for adjusting the termination resistance to 75 Ω or 150 Ω in the LSI circuit.

FIG. 1 shows a diagram (a concept diagram) of a conventional analog termination resistor (ODT) circuit 1 and a termination resistor control circuit 6. FIG. 2 shows the details of the termination resistor control circuit 6.

In this example, the value of a termination resistor 3 is determined by the control circuit 6 connected to a fixed resistor (a reference resistor) 5 serving as a reference. As shown in FIG. 1, the configuration according to this method includes the termination resistor 3 composed of transistors, an input/output buffer 2, and the control circuit 6 for controlling the termination resistance.

The termination resistor control circuit 6 is configured as shown in FIG. 2. In a reference level generation part 6-1 of the control circuit 6, an operational amplifier receives a level in the current path of the series circuit of the reference resistor 5 and a transistor Tr.1, and generates the gate level of a transistor Tr.2. Further, the control circuit 6 includes a transistor Tr.3 connected in series to the transistor Tr.2. The transistor Tr.3 is provided to obtain the same resistance as the reference resistor 5.

Each of transistors Tr.4 and Tr.5 has a function as a switch. The transistors Tr.4 and Tr.5 are controlled by an ODTEN signal, and output respective level signals BIASP and BIASN that control the termination resistance. The level signals BIASP and BIASN are provided from the control circuit 6 to the gates of the corresponding transistors forming the termination resistor 3. The resistance of each of the transistors forming the termination resistor 3 is adjusted so as to be equal to the resistance of the reference resistor 5 by adjusting the gate level.

That is, the transistors (p-channel type and n-channel type FETs) forming the termination resistor 3, and semiconductor devices in the control circuit 6, such as the transistors Tr.1, Tr.2, Tr.3, etc., are all included in the same LSI circuit 1, and are manufactured in the same manufacturing process in the same chip. Accordingly, their characteristics may be substantially the same. Therefore, by realizing the same resistance as that of the reference resistor 5 by each of the transistors Tr.2 and Tr.3 in the control circuit 6, and by extracting the gate levels at that time directly as the level signals BIASP and BIASN and applying them to the gates of the transistors forming the termination resistor 3, the same resistance as the reference resistor 5 can be realized by each of the transistors forming the termination resistor 3.

See Japanese Laid-Open Patent Applications No. 2002-199030 and No. 10-133792.

However, according to the configuration shown in FIGS. 1 and 2, the signal levels of the level signals BIASP and BIASN are analog levels. That is, the resistances of the transistors forming the termination resistor 3 are controlled by controlling the physical state of the transistors with these levels. Accordingly, when interconnection lines for transmitting the level signals BIASP and BIASN are provided inside the LSI, the signals are sensitive to noise generated inside the chip. As a result, it is considered that when voltage applied to the gate terminal of each of the transistors forming the termination resistor 3 is slightly deviated, it is difficult to realize a desired resistance.

In particular, the number of lines forming the interface between an LSI circuit and a memory circuit is generally large. Accordingly, if the control circuit 6 is provided common to the multiple lines, the level signals BIASP and BIASN are provided to each of the corresponding multiple termination resistors 3. As a result, the signals are sensitive to noise.

In order to solve this problem, the control circuit 6 may be provided for each termination resistor 3, for instance. This makes it possible to increase noise immunity. However, this also causes a great increase in the number of terminals of the reference resistor 5 and in chip size, so that a desired specification of circuit size may not be satisfied.

SUMMARY OF THE INVENTION

Accordingly, it is a general object of the present invention to provide a resistance compensation method and a circuit having a resistance compensation function in which the above-described disadvantages are eliminated.

A more specific object of the present invention is to provide a method of controlling a termination resistor (for instance, the above-described ODT) that can significantly increase noise immunity without increasing the number of terminals of a reference resistor and chip size, a circuit having such a resistance compensation function, and a method of testing resistance in such a circuit.

The above objects of the present invention are achieved by a method for compensating for semiconductor device resistance, including the step of (a) realizing a resistance equal to a desired resistance by one of combinations of a plurality of semiconductor devices, step (a) including the step of (b) sequentially selecting two or more of the semiconductor devices to be combined, and thereby sequentially changing a resistance realized by the selected two or more of the semiconductor devices to be combined.

The above objects of the present invention are also achieved by a circuit having a resistance compensation function, including a resistance realization part configured to realize a resistance equal to a desired resistance by one of combinations of a plurality of semiconductor devices, wherein the resistance realization part performs an operation of sequentially selecting two or more of the semiconductor devices to be combined, and thereby sequentially changing a resistance realized by the selected two or more of the semiconductor devices to be combined.

The above objects of the present invention are also achieved by a computer-readable recording medium storing a program for causing a computer to control processing for compensating for semiconductor device resistance, the program comprising instructions for causing the computer to execute the step of (a) realizing a resistance equal to a desired resistance by one of combinations of a plurality of semiconductor devices, step (a) including the step of (b) sequentially selecting two or more of the semiconductor devices to be combined, and thereby sequentially changing a resistance realized by the selected two or more of the semiconductor devices to be combined.

The above objects of the present invention are also achieved by a method for testing a circuit including a resistance realization part configured to realize a resistance equal to a desired resistance by one of combinations of a plurality of semiconductor devices, the method including the step of verifying whether a resistance range realizable by the combinations of the semiconductor devices includes the desired resistance.

The above objects of the present invention are also achieved by a computer-readable recording medium storing a program for causing a computer to control testing of a circuit including a resistance realization part configured to realize a resistance equal to a desired resistance by one of combinations of a plurality of semiconductor devices, the program comprising instructions for causing the computer to execute the step of verifying whether a resistance range realizable by the combinations of the semiconductor devices includes the desired resistance.

According to the present invention, a realized resistance is determined by the selection of semiconductor devices or elements to be combined. Therefore, no analog elements are included in resistance realization. Accordingly, the resistance of a termination resistor can be adjusted with accuracy without being affected by noise. As a result, it is possible to ensure that the same resistance as a desired resistance can be realized as the resistance of the termination resistor, so that it is possible to realize high-speed, accurate data transfer between semiconductor devices or circuits with ease.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
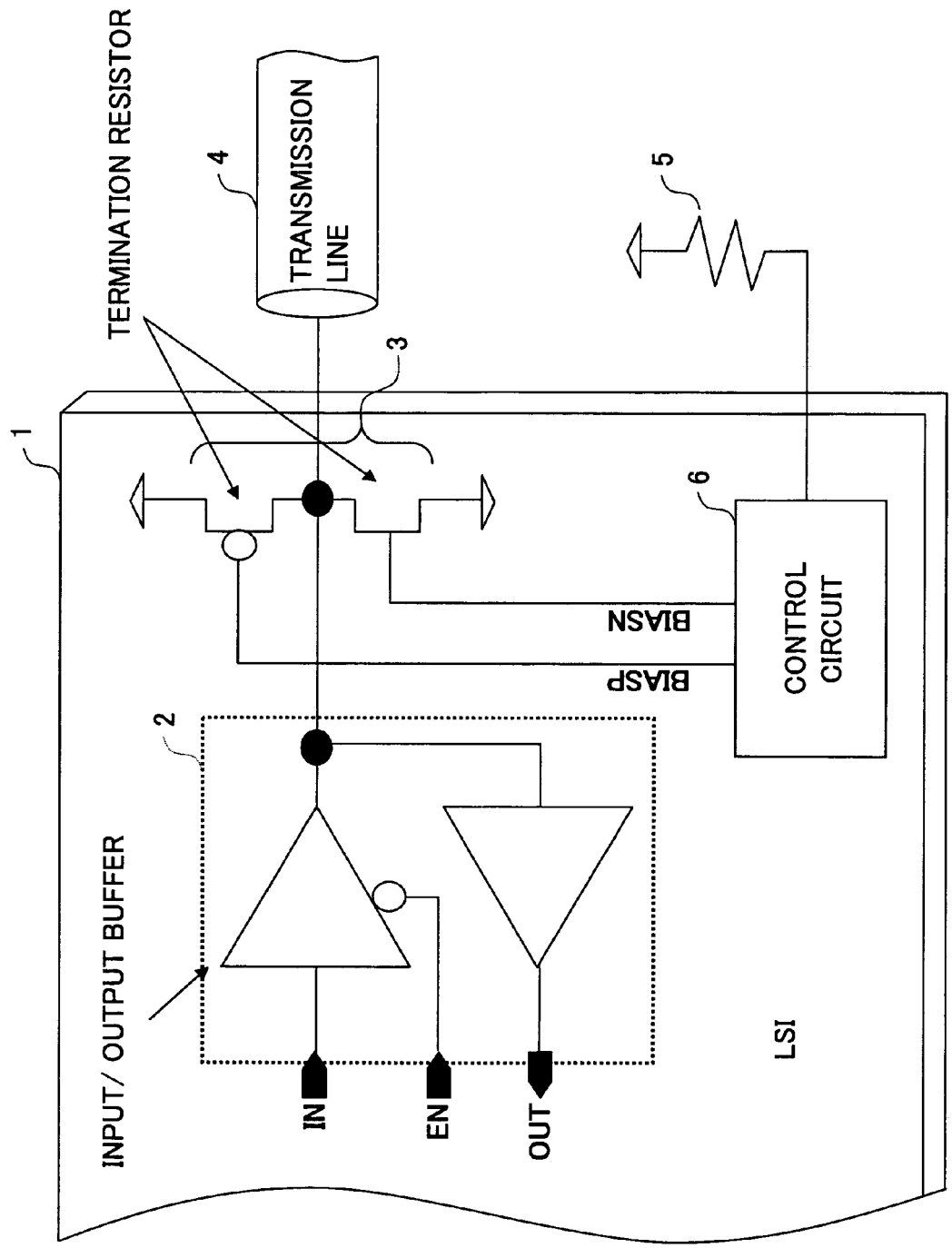
FIG. 1 is a circuit diagram showing part of an LSI configuration including a conventional ODT circuit.
Figure 2:
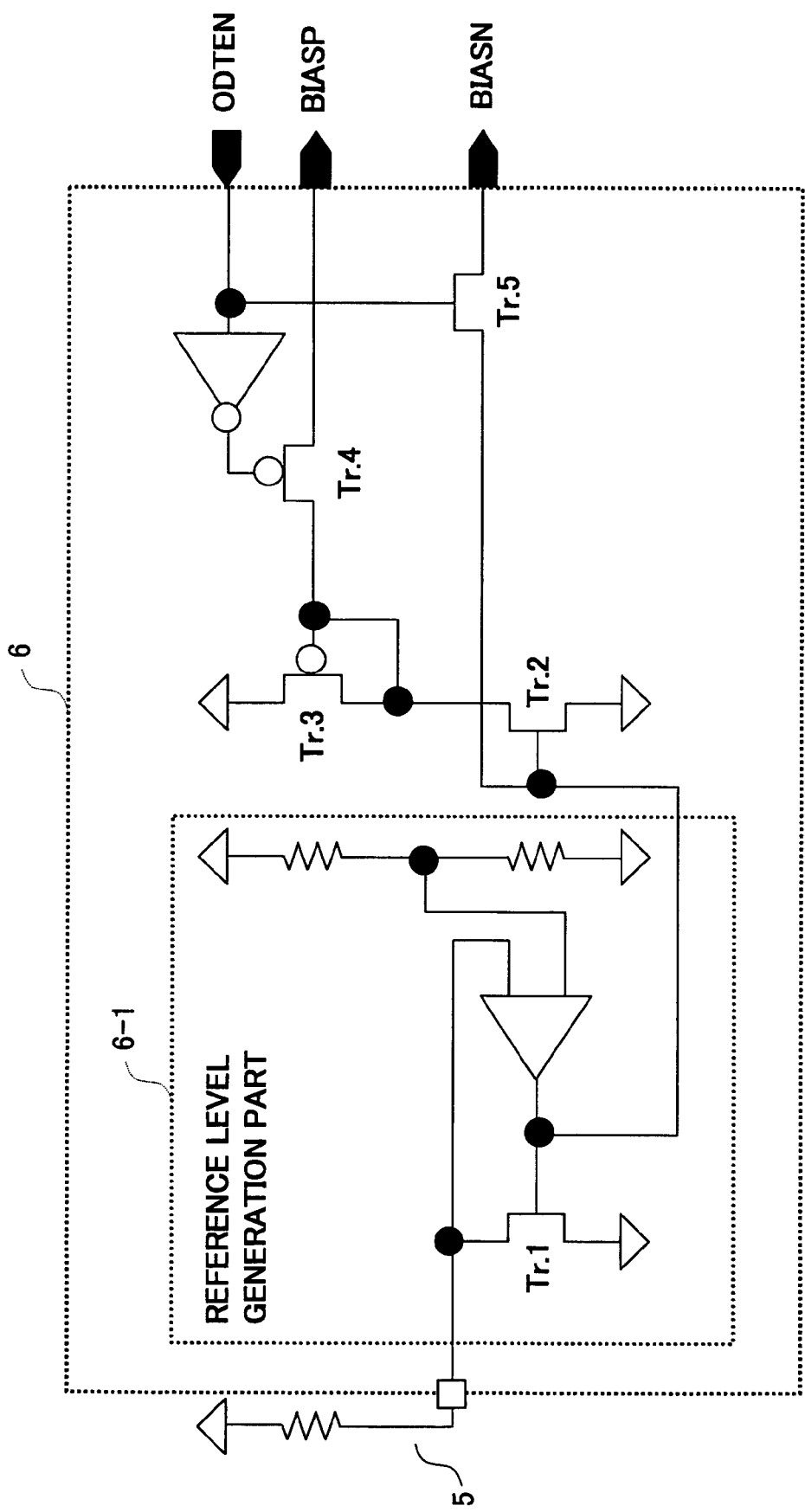
FIG. 2 is a circuit diagram showing an internal circuit of a control circuit shown in FIG. 1.

A description is given below, with reference to the accompanying drawings, of preferred embodiments of the present invention.

According to the embodiments of the present invention, in an LSI having a termination resistor in a chip, a termination resistor adjustment circuit is provided in order to adjust the resistance of the termination resistor. The termination resistor adjustment circuit includes a first variable resistor group set to be equal to the resistance of a predetermined reference resistor. The first variable resistor group is controlled digitally. That is, the resistance of the first variable resistor group is changed stepwise so as to generate the same resistance as the resistance of the reference resistor. Using the first variable resistor group, thus having the same resistance as that of the reference resistor, as a reference, the resistance of the termination resistor is adjusted so that an optimum value as the resistance of the termination resistor is obtained.

Besides the first variable resistor group, the termination resistor adjustment circuit includes second and third variable resistor groups. Of these, the first and second variable resistor groups are configured to be capable of sharing the same information on resistance setting, and based on the information, the resistance of the second variable resistor group is set. The second variable resistor group, whose resistance is thus set, is further employed as a reference resistor for adjusting (controlling) the third variable resistor group.

The setting of the resistance of each of the first through third variable resistor groups is controlled by a counter. That is, the resistance of each of the first through third variable resistor groups is changed based on the counter value of the counter.

The second and third variable resistor groups further have information on the setting of their resistances used as information for setting the resistance of the termination resistor. Accordingly, each of the second and third variable resistor groups has the function of transmitting the information to the termination resistor.

A clock signal that drives the counter for setting the resistances of the first through third variable resistor groups has a frequency sufficiently lower than that of a reference operation clock signal applied inside the LSI.

Information obtained by multiple resistance setting operations on the variable resistance groups is transmitted to the termination resistor as information for setting their resistance after being averaged in advance.

A part configured to externally change the resistances of the first through third resistor groups is provided. The first variable resistor group is connected to a fixed resistor as the reference resistor, and a level detection circuit is connected to the center tap of the fixed resistor and the first variable resistor group so as to detect their resistances. Further, the first and second variable resistor groups are configured to share the same information as information for setting their resistances. The second variable resistor group is connected to the third variable resistor group. A level detection circuit is connected to the center tap of the second and third variable resistor groups so as to detect their resistances. Further, a part configured to transmit the resistance setting information of the first and second variable resistance groups and the resistance setting information of the third variable resistance group to the outside is provided. By extracting the information, a verification test on the ranges in which the resistances of the first through third variable resistor groups are settable is conducted.

That is, first, a test is conducted to verify that the range in which the resistance of the first variable resistor group is settable includes the resistance of the fixed resistor. Next, information on the thus obtained range including the resistance of the fixed resistor is transmitted to the second variable resistor group, and the resistance of the second variable resistor group is set over the range by the information. Then, using the thus set resistance range of the second variable resistor group as a reference, a test is conducted to verify that the settable resistance range of the third variable resistor group includes the resistance range of the second variable resistor group. Thus, in substance, it is verified that the resistance of the third variable resistor group is settable over the resistance range obtained as that of the first variable resistor group including the resistance of the fixed resistor. Thereby, it is also verified that the third variable resistor group is settable to the same resistance as that of the fixed resistor.

Further, a part configured to externally change the resistances of the first through third resistor groups is provided.

In order to realize such a configuration, in the preferred embodiments of the present invention, a control method is digitalized so that information is transmitted with digital level signals ("H" or "L" level) of several bits. Further, by averaging the information, the frequency of updating the actual resistance of the termination resistor is controlled.

Further, a test method is provided to ensure that the settable resistances of each of the first through third variable resistor groups include the resistance of the reference resistor in the LSI circuit as a product.

Further, in the case of digital control as described above, it may take more time before a resistance actually set with respect to the termination resistor is determined because of the averaging operation than in the case of the analog method. However, by providing a configuration that enables a desired value to be input externally as a digital level signal for controlling the termination resistor, it is possible to reduce time required for a product characteristic verification test.

Next, an expatiation is given below of the embodiments of the present invention.

Figure 3:
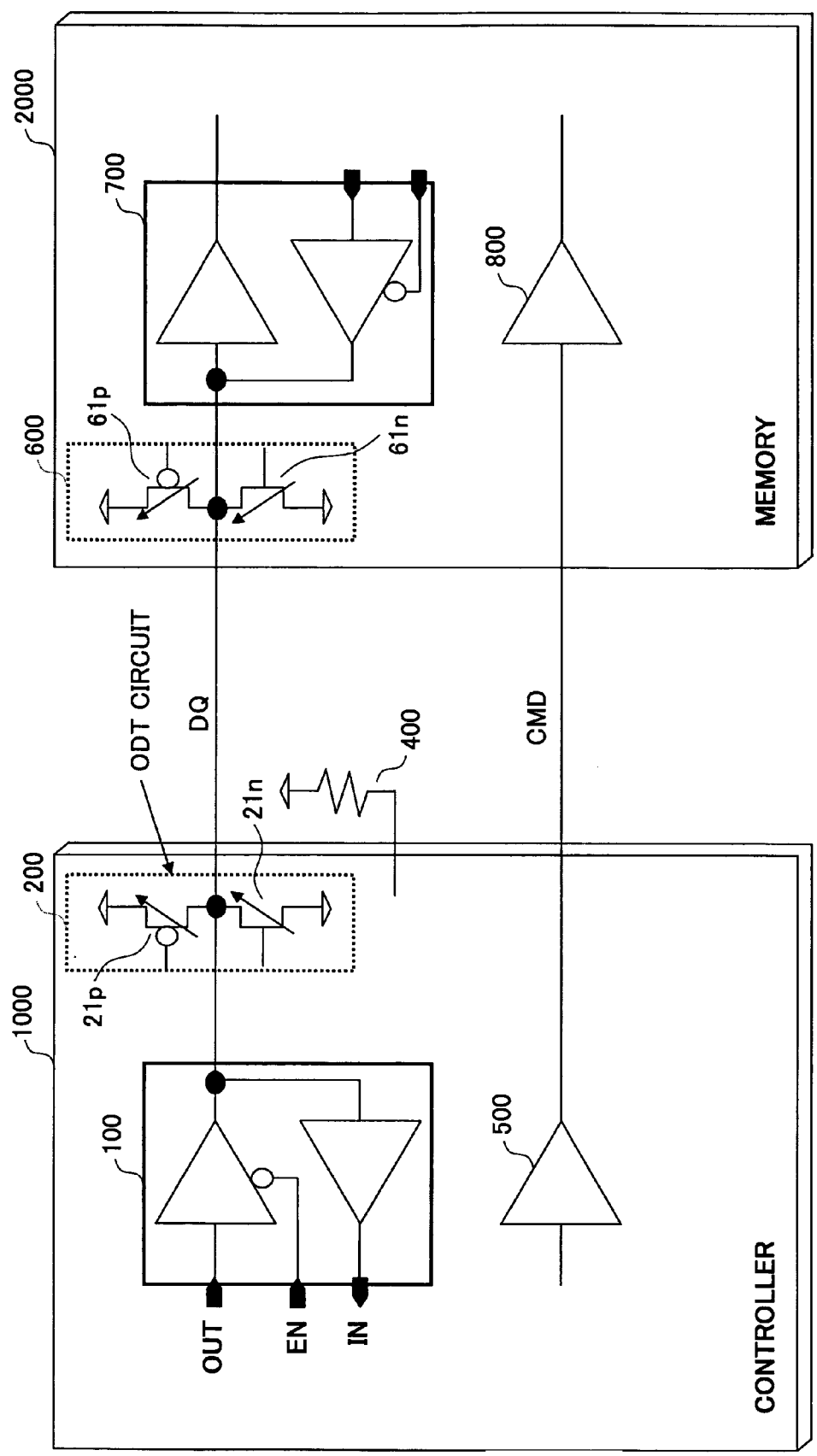
FIG. 3 is a circuit diagram showing a partial configuration of an LSI circuit according to a first embodiment of the present invention.

FIG. 3 is a circuit diagram showing a portion of an LSI circuit 1000 as an embodiment of the present invention which portion relates to the interface with a memory circuit 2000. Referring to FIG. 3, the LSI circuit 1000 includes an input/output buffer 100, an ODT circuit (a variable termination resistor part) 200 as a termination resistor, and an output buffer 500 for sending command information. On the other hand, the memory circuit 2000, which is accessed by the LSI circuit 1000 and is the counterpart device thereof in data transmission (input/output), includes an input/output buffer 700, an ODT circuit 600 as a termination resistor, and an input buffer 800 for receiving command information. A reference resistor 400, which provides a resistance serving as a reference for the resistance of the termination resistor realized in the ODT circuit 200, is connected to the LSI circuit 1000.

The ODT circuit 200 includes a p-channel transistor $21p$ and an n-channel transistor $21n$, and the counterpart ODT circuit 600 includes a p-channel transistor $61p$ and an n-channel transistor $61n$. The transistors $21p$ and $21n$ are connected in series across a signal line DQ between a power supply line and a ground line so as to form a termination resistor. The transistors $61p$ and $61n$ are connected in series across the signal line DQ between a power supply line and a ground line so as to form a termination resistor. By controlling the value of each termination resistor in the ODT circuit 200 appropriately so that the value is equal to the resistance of a reference resistor (for instance, the reference resistor 400), the signal level of the signal line DQ is appropriately controlled, so that high-speed, accurate data transfer can be realized.

Figure 4:
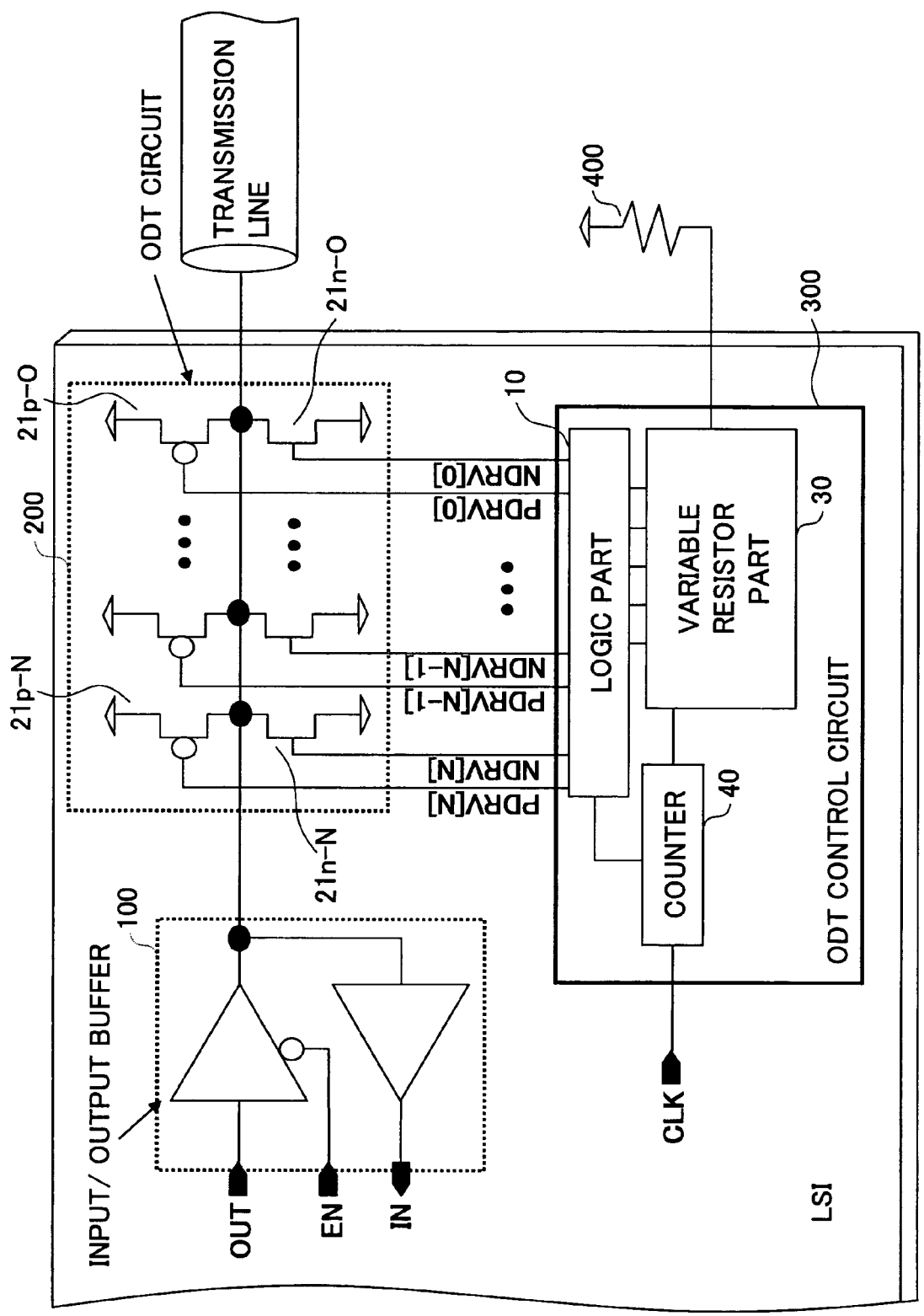
FIG. 4 is a circuit diagram showing further details of the partial configuration of the LSI circuit shown in FIG. 3 including an ODT control circuit implementing a resistance compensation method according to the first embodiment of the present invention.

FIG. 4 is a circuit diagram showing a configuration of the ODT circuit 200 and a configuration of an ODT control circuit (a termination resistor control circuit) 300 included in the LSI circuit 1000. As shown in FIG. 4, the ODT circuit 200 is configured by multiple parallel-connected pairs of p-channel type and n-channel type transistors $21p$-0, $21n$-0, $21p$-1, $21n$-1, ..., $21p$-(N-1), $21n$-(N-1), $21p$-N, $21n$-N, which form a termination resistor. Control signals PDRV[0], NDRV[0], PDRV[1], NDRV[1], ..., PDRV[N-1], NDRV[N-1], PDRV[N], NDRV[N] output from the ODT control circuit 300 are applied to the gates of the corresponding transistors, so that the transistors are turned ON/OFF. Thus, in substance, the substantial number of parallel-connected pairs of transistors connected across the signal line DQ between the power supply line and the ground line is adjusted, so that the resistance of the ODT circuit 200 as a termination resistor is controlled.

The ODT control circuit 300 includes a variable resistor part 30, a counter part 40, and a logic part 10. The variable resistor part 30 is connected to the external reference resistor 400, and realizes a resistance. The counter part 40 and the logic part 10 control the variable resistor part 30.

Figure 5:
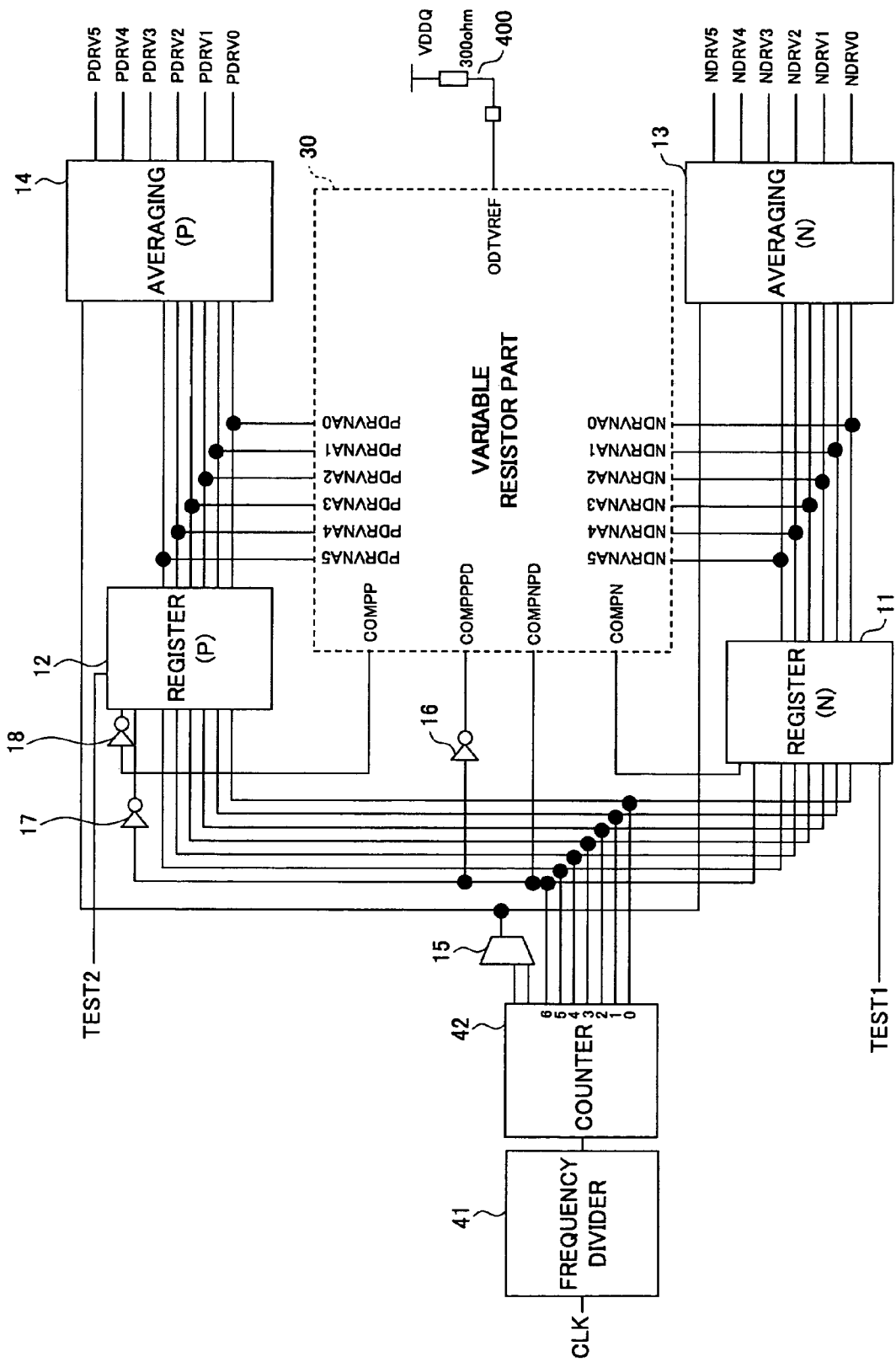
FIG. 5 is a circuit diagram showing an internal configuration of the ODT control circuit shown in FIG. 4 according to the first embodiment of the present invention.

FIG. 5 is a circuit diagram showing the details of the configuration of the ODT control circuit 300.

The circuit 300 includes a counter 42, a frequency divider 41 generating a clock input to the counter 42, logic circuits 11, 12, 13, 14, 15, 16, 17, and 18, and the variable resistor part 30. The logic part 10 shown in FIG. 4 includes a register (P) 12, a register (N) 11, an averaging circuit (P) 13, and an averaging circuit (N) 14. Signals TEST1 and TEST2 for inputting resistance setting information directly from outside are provided to the register (N) 11 and the register (P) 12, respectively.

Figure 6:
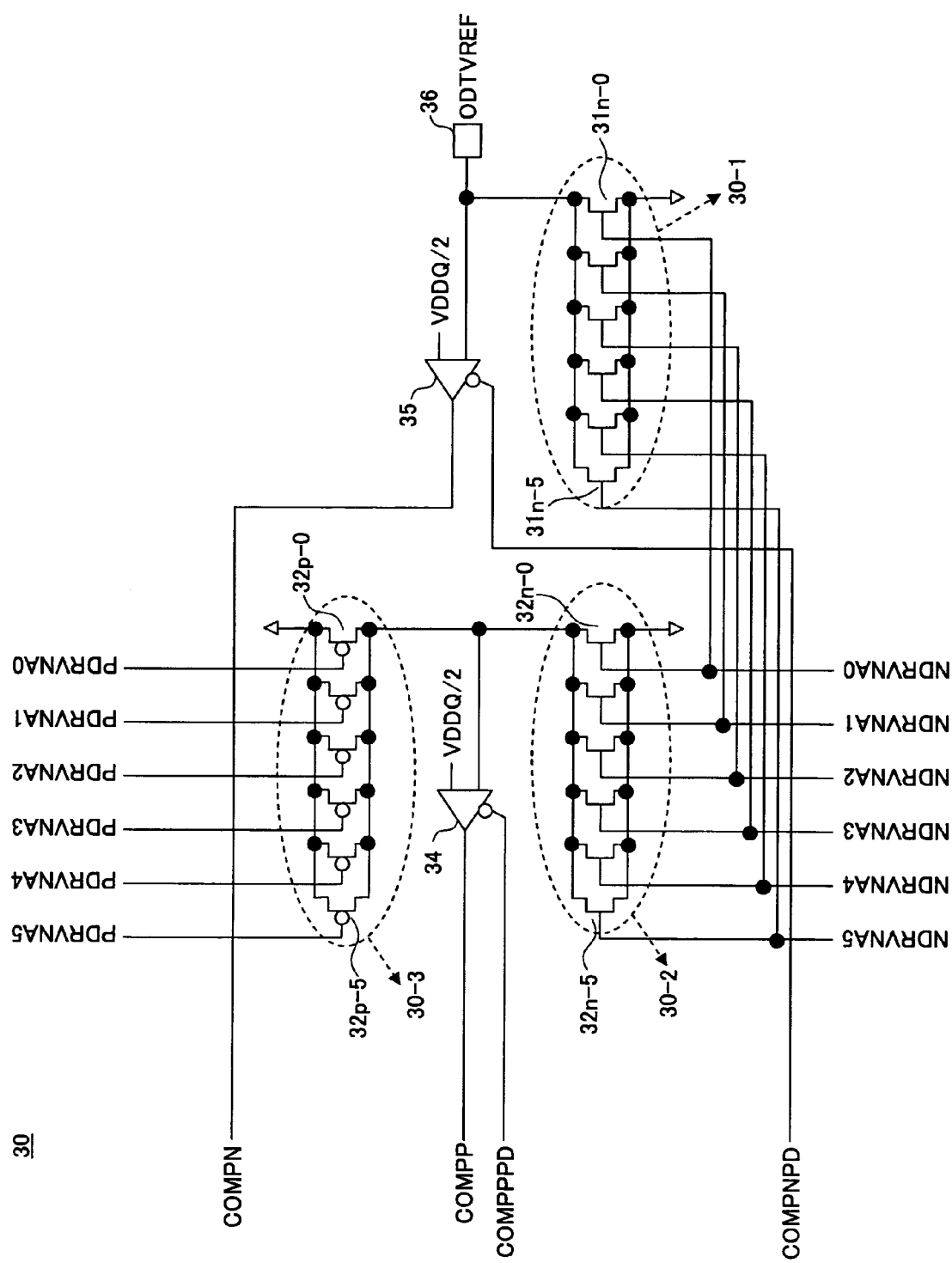
FIG. 6 is a circuit diagram showing an internal configuration of a variable resistor part shown in FIG. 5 according to the first embodiment of the present invention.

FIG. 6 is a circuit diagram showing the detailed configuration of the variable resistor part 30 shown in FIG. 4 and FIG. 5.

The circuit of the variable resistor part 30 includes first through third variable resistor circuit groups 30-1, 30-2, and 30-3, a first comparator circuit 35, and a second comparator circuit 34. The first variable resistor group 30-1 is configured by six n-channel type transistors $31n$-0, $31n$-1, ..., $31n$-5 that are connected in parallel. The second variable resistor group 30-2 is configured by six n-channel type transistors $32n$-0, $32n$-1, ..., $32n$-5 that are connected in parallel. The third variable resistor group 30-3 is configured by six p-channel type transistors $32p$-0, $32p$-1, ..., $32p$-5 that are connected in parallel.

This case corresponds to the case where the pairs of the p-channel type and n-channel type transistors $21p$-0, $21n$-0, 21p-1, 21n-1, . . . , 21p-(N-1), 21n-(N-1), 21p-N, 21n-N forming the termination resistor in FIG. 4 are six in number (N=5). That is, each of the transistor groups forming the respective first through third variable resistor groups 30-1 through 30-3 corresponds to the transistor pairs forming the termination resistor.

As shown in FIG. 6, control signals NDRVNA0, NDRVNA1, . . . , NDRVNA5 or control signals PDRVNA0, PDRVNA1, . . . , PDRVNA5 are applied to the gates of the corresponding transistors of each of the variable resistor groups 30-1 through 30-3, so that the transistors are turned ON/OFF. As a result, in substance, a combination of transistors to be connected in parallel is determined. In consequence, a resistance realized by the parallel circuits is controlled.

The second variable resistor group 30-2 is designed to have the same logic and the same physical shape as the first variable resistor group 30-1. Accordingly, the second variable resistor group 30-2 is configured to be able to obtain the same resistance as the first variable resistor group 30-1 when the same control signals NDRVNA0, NDRVNA1, . . . , NDRVNA5 for the first variable resistor group 30-1 are applied to the second variable resistor group 30-2. The variable resistor group 30-3 is connected in series to the second variable resistor group 30-2, and is configured to realize an optimum resistance by turning ON/OFF the transistors 32p-0, 32p-1, 32p-5 with the control signals PDRVNA0, PDRVNA1, PDRVNA5 using the resistance of the second variable resistor group 30-2 as a reference. The above-mentioned control is described in detail below.

As described above, the first and second resistor groups 30-1 and 30-2 are configured by n-channel transistors, and the third variable resistor group 30-3 is configured by p-channel transistors.

As shown in FIG. 6, the first variable resistor group 30-1 is connected to an external terminal (ODTVREF) 36 to which the reference resistor 400 is connected, and further is connected to the first comparator circuit 35 at the same connection. The first comparator circuit 35 compares a voltage level at the connection of the reference resistor 400, connected between the first comparator circuit 35 and a power supply line, and the first variable resistor group 30-1, connected between the first comparator circuit 35 and a ground line, and a predetermined threshold level VDDQ/2, thereby performing level detection at the connection. Likewise, the second comparator circuit 34 is connected to the connection of the second and third resistor groups 30-2 and 30-3, and performs level detection at the connection of the third variable resistor group 30-3, connected between the second comparator circuit 34 and power supply level, and the second variable resistor group 30-2, connected between the second comparator circuit 34 and ground level.

Figure 7:
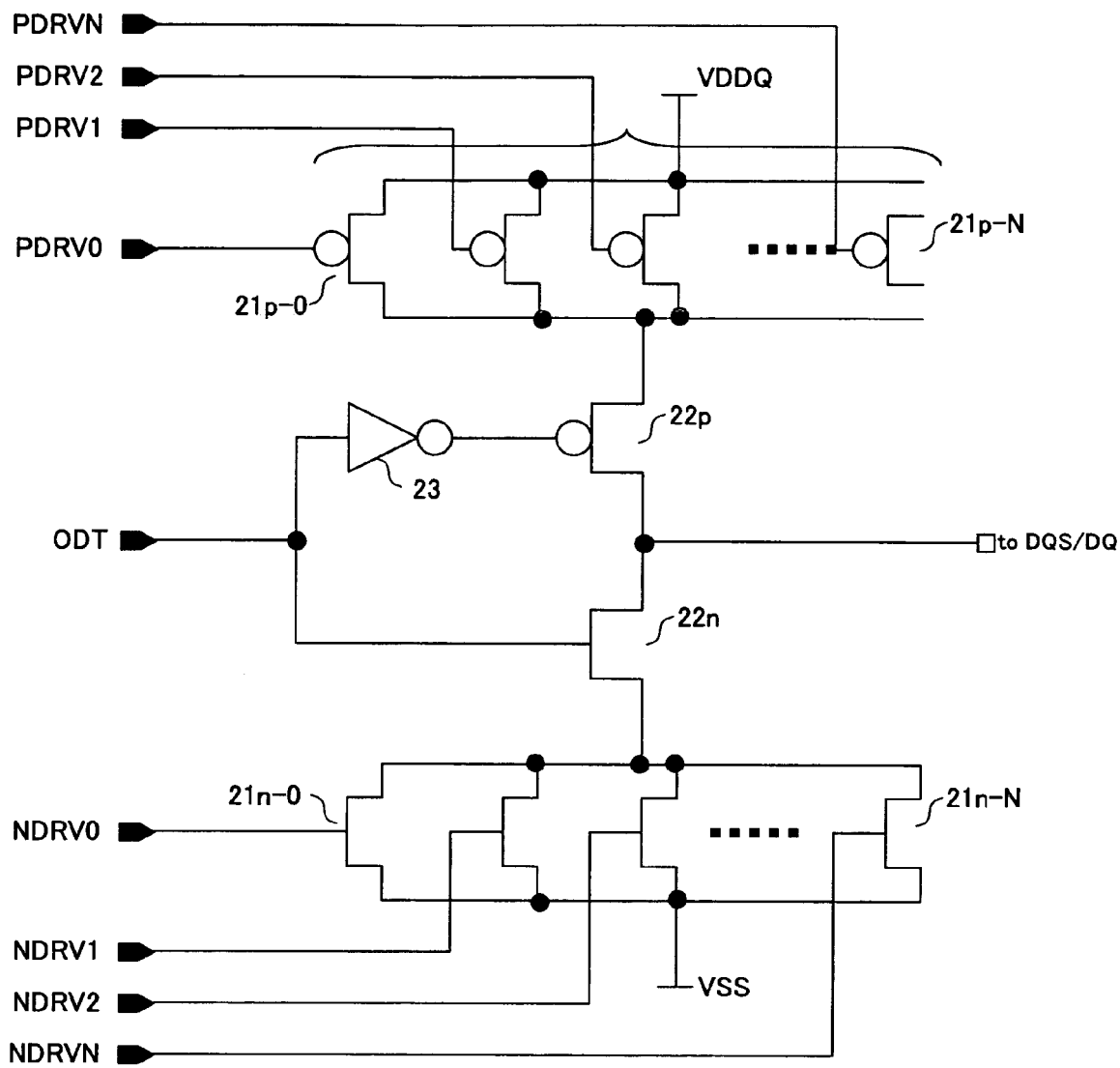
FIG. 7 is a circuit diagram showing the details of the ODT circuit shown in FIG. 4 according to the first embodiment of the present invention.

FIG. 7 is a circuit diagram showing a detailed circuit configuration of the ODT circuit 200 shown in FIG. 4. Like the first through third variable resistor groups 30-1 through 30-3 shown in FIG. 6, this circuit 200 is a variable termination resistor circuit where transistors 21p-0, 21p-1, 21p-2, . . . , 21p-N are connected in parallel and transistors 21n-0, -21n-1, 21n-2, . . . , 21n-N are connected in parallel. Control signals PDRV0, PDRV1, PDRVN or control signals NDRV0, NDRV1, . . . , NDRVN are applied to the gates of the corresponding transistors, so that the transistors are turned ON/OFF. As a result, the combination of transistors substantially connected in parallel is controlled, so that a resistance realized by the parallel circuit is controlled.

Further, it is possible to switch ON/OFF the connection to the signal line DQS/DQ of the variable termination resistor through transistors 22p and 22n using an ODT signal. That is, all the transistors 21p-0, 21p-1, 21p-2, . . . , 21p-N, 21n-0, 21n-1, 21n-2, . . . , 21n-N as the termination resistor of the ODT circuit 200 can be connected to or disconnected from the signal line.

Figure 8:
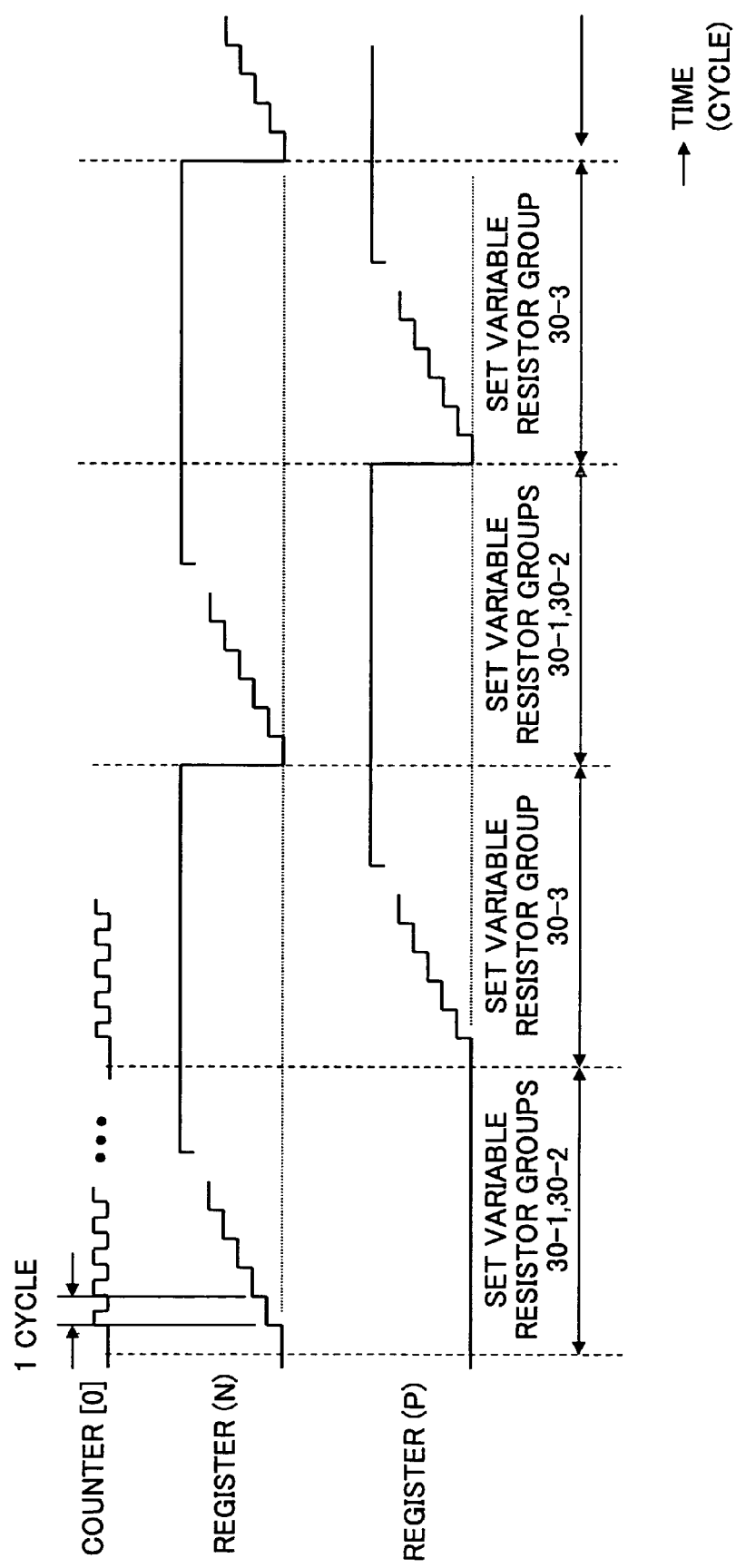
FIG. 8 is a timing chart for illustrating a resistance setting operation performed by a logic part of the ODT control circuit shown in FIGS. 4 and 5 according to the first embodiment of the present invention.

FIG. 8 is a timing chart for illustrating a resistance setting operation by the ODT circuit 200. Waveforms shown in FIG. 8 are the output waveforms of the $0^{th}$ bit of the counter 42, the register (P) 12, and the register (N) 11. The resistances of the variable resistor groups 30-1 through 30-3 can be changed by inputting the counter value of the counter 42 thereto as control signals. Specifically, by controlling the combination of transistors substantially forming a parallel circuit as each variable resistor group, the resistance of the parallel circuit can be changed as described above.

In FIG. 8, the horizontal axis represents time (cycle), and the vertical axis represents stepwise changes in the output values of each of the register (N) 11 and the register (P) 12. Changes in the output values of the registers 11 and 12 indicate resistances realized by the variable resistor groups 30-1 through 30-3 to which the output signals of the registers 11 and 12 are provided as control signals. That is, in FIG. 8, with the output cycle of the $0^{th}$ bit of the counter 42 being one cycle, the values of the registers 11 and 12 are changed sequentially every cycle.

As shown in FIG. 8, in the first through third variable resistor groups 30-1 through 30-3, the setting of the n-channel type transistor side (that is, the variable resistor groups 30-1 and 30-2) and the setting of the p-channel type transistor side (that is, the variable resistor group 30-3) are repeated alternately, and in each cycle, the corresponding one of the first and second comparator circuits 34 and 35 performs level detection. That is, the resistances of the reference resistor 400 and the first variable resistor group 30-1 are compared, and the resistances of the second and third variable resistor groups 30-2 and 30-3 are compared. In each cycle, a set value, that is, an H/L (HIGH LEVEL/LOW LEVEL) combination of control signals, at the time when the resistances match each other is obtained as a result of the comparison. The set values thus obtained are averaged in the corresponding averaging circuit 13 or 14 so as to be transmitted to the ODT circuit 200 as resistance setting control information.

Specifically, first, the n-channel type transistor side (the first and second variable resistor groups 30-1 and 30-2) is set. That is, the n-bit (for instance, 7-bit in the case of FIG. 5) counter 42 is put into operation so as to change the resistance of each of the variable resistor groups 30-1 and 30-2. That is, the transistors of each of the variable resistor groups 30-1 and 30-2, having the control signals applied to their respective gates, are turned ON/OFF based on the H/L levels of the corresponding control signals output from the counter 42, the control signals corresponding to the bits thereof. Of the transistors, those turned ON form a parallel circuit, while those turned OFF do not form the parallel circuit. As a result, the resistance of the parallel circuit is changed. The transistors of each of the first through third variable resistor groups 30-1 through 30-3 are configured so that the ratio of their respective resistances obtained when the transistors are turned ON is as described below. As a result, the resistance of the parallel circuit formed by the transistors turned ON by the 6-bit ($0^{th}$ to $5^{th}$ bits) output of the counter 42 can be configured so as to sequentially increase or decrease stepwise with the updating of the count value of the counter 42 as the output of each of the registers 11 and 12 shown in FIG. 8.

31n-0:31n-1:31n-2:31n-3:31n-4:31n-5=32n-0:32n-1:
 32n-2:32n-3:32n-4:32n-5=32p-0:32p-1:32p-2:32p-3:
 32p-4:32p-5=32:16:8:4:2:1; or
31n-0:31n-1:31n-2:31n-3:31n-4:31n-5=32n-0:32n-1:
 32n-2:32n-3:32n-4:32n-5=32p-0:32p-1:32p-2:32p-3:
 32p-4:32p-5=32 1:2:4:8:16:32.

In the case of this configuration, the transistors forming the ODT circuit 200 are also configured so that their respective resistances obtained when the transistors are turned ON satisfy the following ratio. As a result, the same resistance can be realized by the common control signals.

21n-0:21n-1:21n-2:21n-3:21n-4:21n-5=21p-0:21p-1:
 21p-2:21p-3:21p-4:21p-5=32:16:8:4:2:1; or
21n-0:21n-1:21n-2:21n-3:21n-4:21n-5=21p-0:21p-1:
 21p-2:21p-3:21p-4:21p-5=1:2:4:8:16:32.

With the changing in the resistances, transition of the output of the first comparator circuit 35 shown in FIG. 6 occurs at some point. The register (N) 11 latches control information at the point when transition of the output data COMPN of the first comparator circuit 35 occurs. The point at which the output data COMPN of the first comparator circuit 35 switches coincides with the point at which the resistance of the first variable resistor group 30-1 is set to substantially the same resistance as the external resistor (the reference resistor 400), and therefore, also coincides with the point at which the resistance of the second variable resistor group 30-2 is set to substantially the same resistance as the reference resistor 400.

That is, the threshold voltage VDDQ/2 serving as a reference in the comparison by the first comparator circuit 35 is set to a voltage that is the half of supply voltage. As a result, when the resistance of the reference resistor 400 and the resistance of the first variable resistor group 30-1 are equalized, their respective voltage drops are equalized. In consequence, a voltage level at their connection becomes the half of the supply voltage so as to be equal to the reference threshold voltage. Accordingly, the transition of the output of the first comparator circuit 35 occurs at that point.

Next, the setting of the p-channel type transistor side (the third variable resistor group 30-3) is entered. The third variable resistor group 30-3 is set based on the switching of the level of the (N-1)$^{th}$ bit (the 6$^{th}$ bit in the illustrated case) of the counter 42. That is, as shown in FIG. 5, the 6$^{th}$-bit output is provided directly to the register (N) 11, and is provided to the register (P) 12 after being inverted through the inverter 17. The output of each of the registers 11 and 12 is switched ON/OFF based on the level of the 6$^{th}$-bit output.

As in the case of setting the above-described n-channel type transistor side (the variable resistor groups 30-1 and 30-2), the resistance of the third variable resistor group 30-3 is also changed sequentially by the output information of the counter 42 through the register (P) 12 in this case. As in the above-described case, as a result of sequential variations in the resistance of the third variable resistor group 30-3, the state transition of the second comparator circuit 34 occurs at some point, that is, at the time when the resistance of the third variable resistor group 30-3 thus changed sequentially is equalized substantially with the resistance of the second variable resistor group 30-2.

The register (P) 12 detects this point by the output signal COMPP of the second comparator circuit 34, and latches the control information of this case (that is, the output bit information of the counter 42, or the control signals to the third variable resistor group 30-3). As described above, the resistance of the second variable resistor group 30-2 has been equalized substantially with the resistance of the external reference resistor 400 by the settings of the n-channel type transistor side (the first and second variable resistor groups 30-1 and 30-2). Accordingly, the resistance of the third variable resistor group 30-3 thus set based on the resistance of the second variable resistor group 30-2 is also substantially equal to the resistance of the external reference resistor 400.

While the above-described n-channel type transistor side setting operation and p-channel type transistor side setting operation are being repeated sequentially, the register (N) 11 latches every control information item that equalizes the resistance of each of the first and second variable resistor groups 30-1 and 30-2 with that of the external reference resistor 400, and the register (P) 12 latches every control information item that equalizes the resistance of the third variable resistor group 30-3 with that of the external reference resistor 400. This resistance setting information is transmitted to and subjected to averaging in the corresponding averaging circuits (N) 13 and (P) 14, and is transmitted to the ODT circuit 200 as the resistance setting control information.

The resistances of the first through third variable resistor groups 30-1 through 30-3 and the ODT circuit 200, which are formed by transistors, vary because of a process, temperature, and supply voltage. However, in actual operations, the resistance of the ODT circuit 200 does not vary so frequently. Accordingly, it is believed that there is little possibility of reducing substantial accuracy of resistance compensation even with a method that repeats the above-described n-channel type transistor side setting operation and p-channel type transistor side setting operation several times, thereafter averages the results in the averaging circuit (N) 13 and the averaging circuit (P) 14, and transmits the averaged control signals to the ODT circuit 200. Further, employment of this method eliminates the necessity of transmitting digital levels that are control signals for the resistance of the termination resistor every base clock cycle. This makes it possible to prevent an increase in current consumption.

Figure 9:
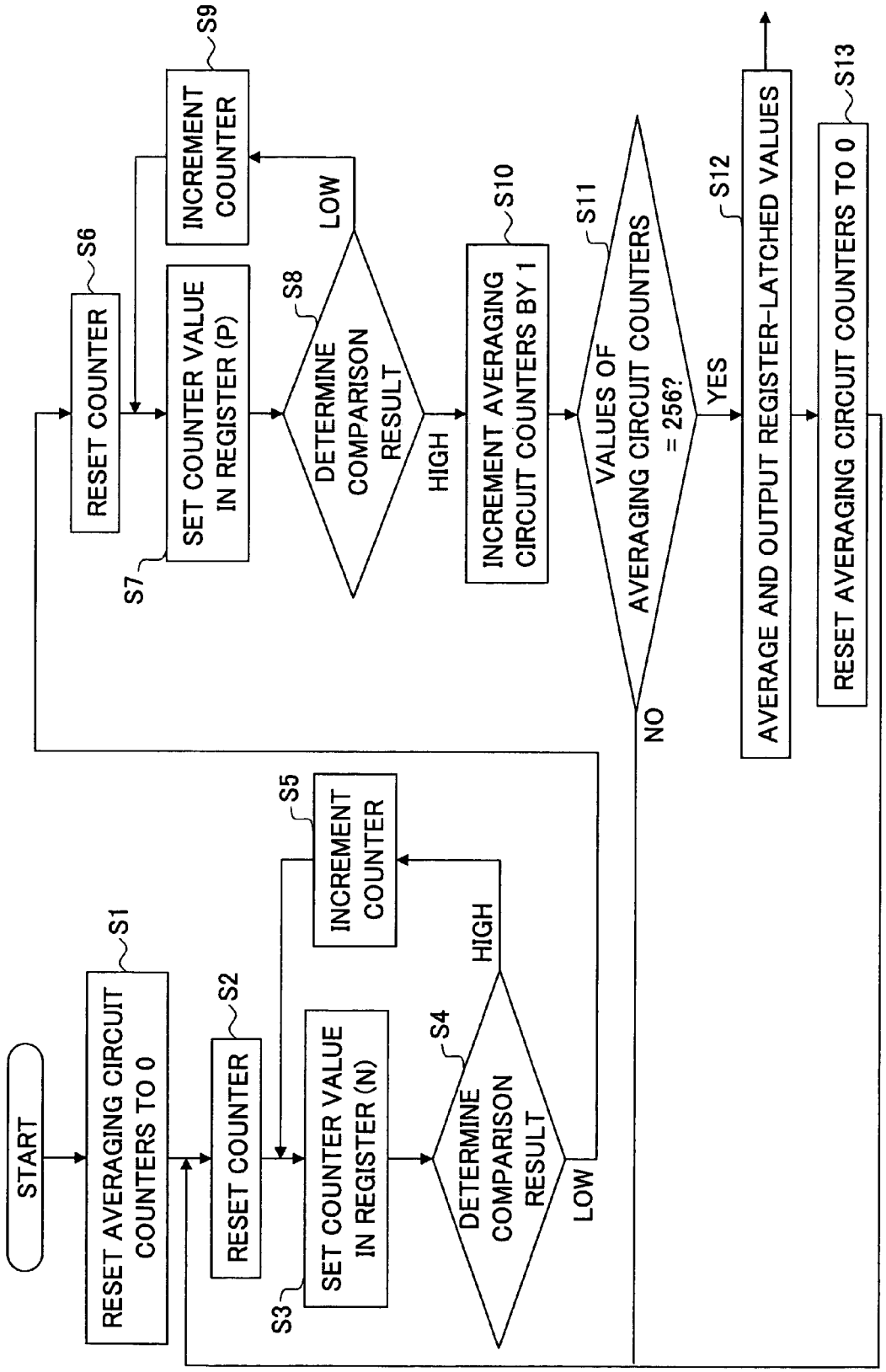
FIG. 9 is an operational flowchart of the resistance setting operation performed by the logic part of the ODT control circuit shown in FIGS. 4 and 5 according to the first embodiment of the present invention.

FIG. 9 is an operational flowchart of the above-described resistance setting operation. Referring to FIG. 9, first, in step S1, the counter of each of the averaging circuits 13 and 14 is reset to zero. In step S2, the counter 42 is reset. In step S3, the value of the counter 42 is set in the register (N) 11. As a result, the resistance of each of the first and second resistor groups 30-1 and 30-2 is set by the control signals corresponding to the counter value. In step S4, the comparison result of the first comparator circuit 35 is determined. If the comparison result is NO TRANSITION, indicating the absence of transition (HIGH in step S4), in step S5, the counter 42 is incremented, and the operation returns to step S3.

If the comparison result in step S4 is TRANSITION, indicating the presence of transition (LOW in step S4), that is, in the case where the resistance of the first variable resistor group 30-1 is substantially equal to the resistance of the reference resistor 400, the value of the register (N) 11 at this point (resistance setting information) is latched. Then, in step S6, the counter 42 is reset, and in step S7, the counter value of the counter 42 is set in the register (P) 12. As a result, the resistance of the third resistor group 30-3 is set by the control signals corresponding to the counter value. In step S8, the comparison result of the second comparator circuit 34 is determined. If the comparison result is NO TRANSITION, indicating the absence of transition (LOW in step S8), in step S9, the counter 42 is incremented, and the operation returns to step S7.

If the comparison result in step S8 is TRANSITION, indicating the presence of transition (HIGH in step S8), that is, in the case where the resistance of the third variable resistor group 30-3 is substantially equal to the resistance of the second variable resistor group 30-2, the value of the register (P) 12 at this point (resistance setting information) is latched. Then, in step S10, the counter value of each of the averaging circuits 13 and 14 is incremented by one, and in step S11, it is determined whether the counter value of each of the averaging circuits 13 and 14 reaches 256. If YES in step S11, in step S12, the resistance setting information values that have been latched so far by the registers 11 and 12 are averaged by the averaging circuits 13 and 14, respectively, so as to be transmitted to the ODT circuit 200 as the resistance setting control information. In step S13, the counter values of the averaging circuits 13 and 14 are reset to zero, and the operation returns to step S2. If the determination result of step S11 is NO, steps S2 through S11 described above are repeated.

Normally, the termination resistance adjustment (compensation) method thus described with reference to FIG. 9 is built into an LSI as a control circuit. Alternatively, a method that externally operates the control is also possible. The external control method can be implemented by causing a computer to execute the method, using a program including instructions for causing the computer to execute the method. In this case, an interface for inputting data (such as resistance setting control signals) from the computer to a target LSI circuit and transmitting comparison results (the outputs of the first and second comparator circuits 35 and 34) from the LSI circuit to the computer is required. The program in this case is loaded into the computer via a portable recording medium such as a CD-ROM or a communications network such as the Internet.

Figure 10:
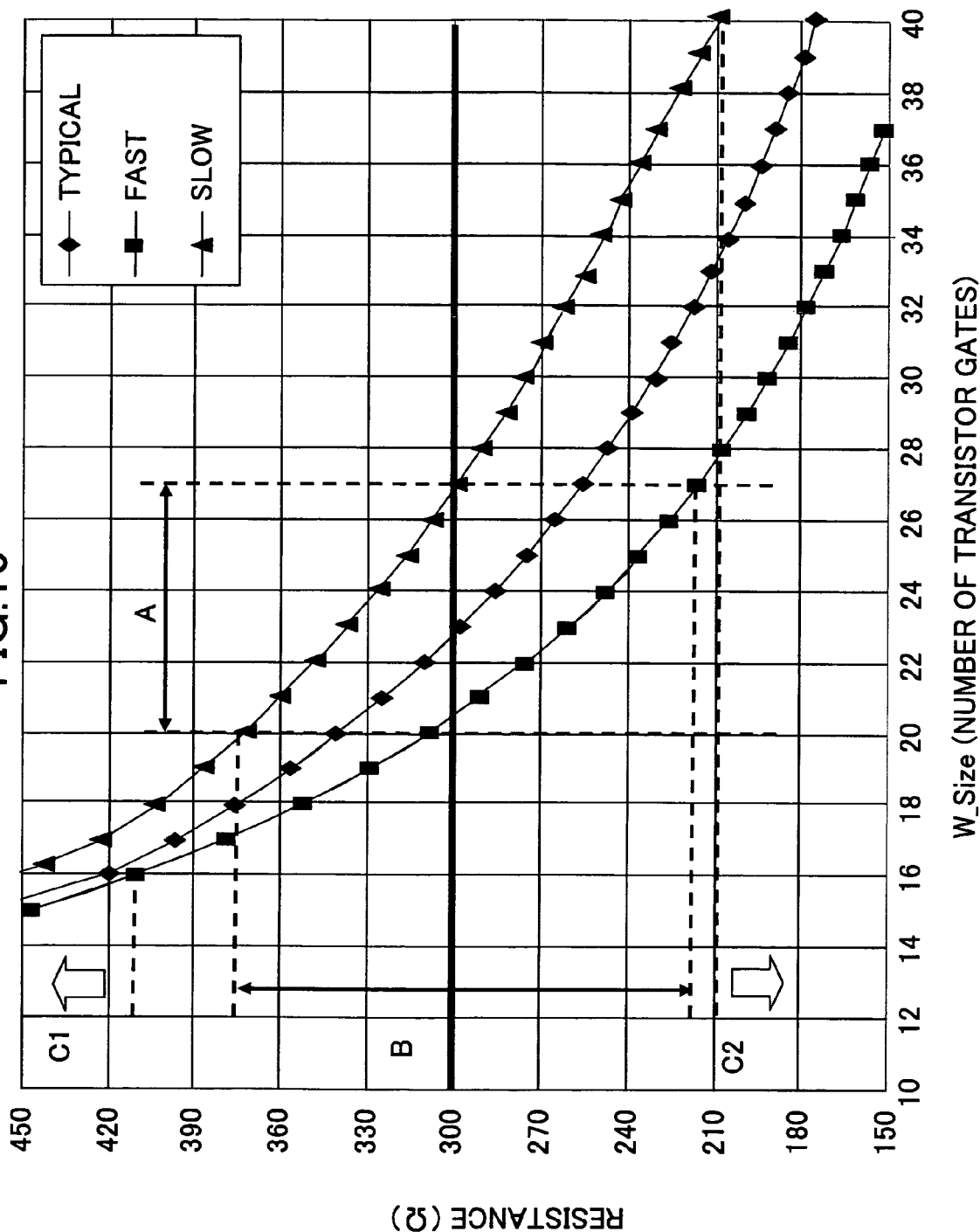
FIG. 10 is a graph for illustrating the principles of a resistance test method, showing variations in device resistance, according to a second embodiment of the present invention.

FIG. 10 is a graph for illustrating the principles of a method for testing whether the settable resistances of each of the first through third variable resistor groups 30-1 through 30-3 of the ODT control circuit 300 of the LSI circuit 1000 can include the resistance of the reference resistor 400 according to a second embodiment of the present invention. The horizontal axis of this graph represents the number of transistor gates, and the vertical axis of this graph represents the resistance of a parallel circuit at the time when as many transistors as the corresponding number of transistor gates are turned ON to form the parallel circuit.

In general, an LSI circuit includes process variations. Accordingly, the characteristics of the transistors forming the LSI circuit cannot be determined uniquely, and vary within the range between SLOW (minimum transistor driveability) and FAST (maximum transistor driveability) shown in the graph of FIG. 10. Provided that the resistance of the reference resistor 400 is 300 Ω, considering the above variations, the number of transistors forming a parallel circuit necessary to realize this resistance varies between 20 and 27 (Range A in FIG. 10). Taking these variations into account, when the number of transistors forming the parallel circuit is varied within the range of 20–27 with 300 Ω being targeted as the termination resistance, the resistance of the parallel circuit takes corresponding values within the range of 215–375 Ω (Range B in FIG. 10). This shows the range of values that can be taken by each of the first and second variable resistor groups 30-1 and 30-2 shown in FIG. 6.

Accordingly, at the time of testing the resistance of the ODT control circuit 300, when the number of transistor gates is set to 20, it should be determined that the resistance of the first variable resistor group 30-1 is greater than the resistance of the reference resistor 400. When the number of transistor gates is set to 27, it should be determined that the resistance of the first variable resistor group 30-1 is less than the resistance of the reference voltage 400. As a result, it is possible to ensure that the first variable resistor group 30-1 can be set to have the same resistance as the reference resistance of 300 Ω.

Next, the possible resistances of the third variable resistor group 30-3 are ensured. As described above, the second variable resistor group 30-2 has the same resistance as the first variable resistor group 30-1. As shown in FIG. 10, when the number of transistor gates is set to 20, the resistance of the second variable resistor group 30-2 is around 375 Ω (the upper limit of Range B) when the process characteristics are SLOW. Accordingly, the number of transistor gates for the third variable resistor group 30-3 is set to 16 so that the resistance of the third variable resistor group 30-3 is higher than that value (around 375 Ω). In this state, it should be determined that the resistance of the third variable resistor group 30-3 is higher than the resistance of the second variable resistor group 30-2 (that is, Range C1 in FIG. 10).

Next, the number of transistor gates is set to 27 for the second variable resistor group 30-2, and to 40 for the third variable resistor group 30-3. Then, in this state, it should be determined that the resistance of the third variable resistor group 30-3 is lower than the resistance of the second variable resistor group 30-2 (that is, Range C2 in FIG. 10). As a result, it is ensured that the third variable resistor group 30-3 can be set so as to cover the resistance range of the second variable resistor group 30-2 that it has been determined can be set to have the reference resistance (=300 Ω) As a result, it is also ensured that the third variable resistor group 30-3 can be set to have the same resistance as the reference resistance of 300 Ω.

The actual number of transistors forming the parallel circuit of each of the first through third variable resistor groups 30-1 through 30-3 does not have to be 40 as specified above. For instance, with the above-described method that differentiates the resistances of the transistors of each parallel circuit at the time of turning ON from each other, and setting their resistance ratio to, for instance, 1:2:4:8:16:32, substantially the same resistance as that by the above-described specified gate number/transistor number can be realized even when the number of transistors forming the parallel circuit is six as described above.

Figure 11A:
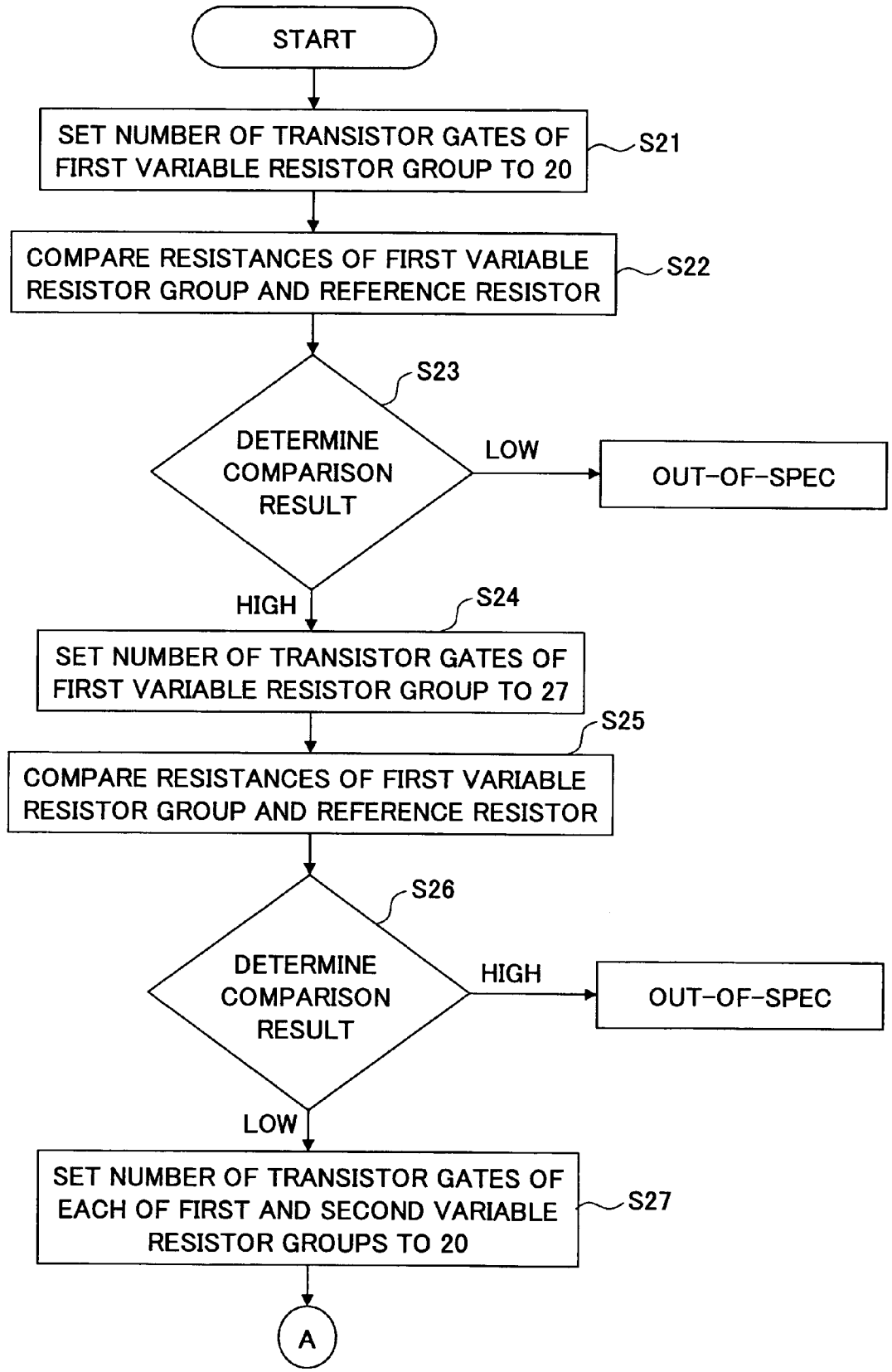
FIGS. 11A and 11B are operational flowcharts of the resistance test method according to the second embodiment of the present invention.
Figure 11B:
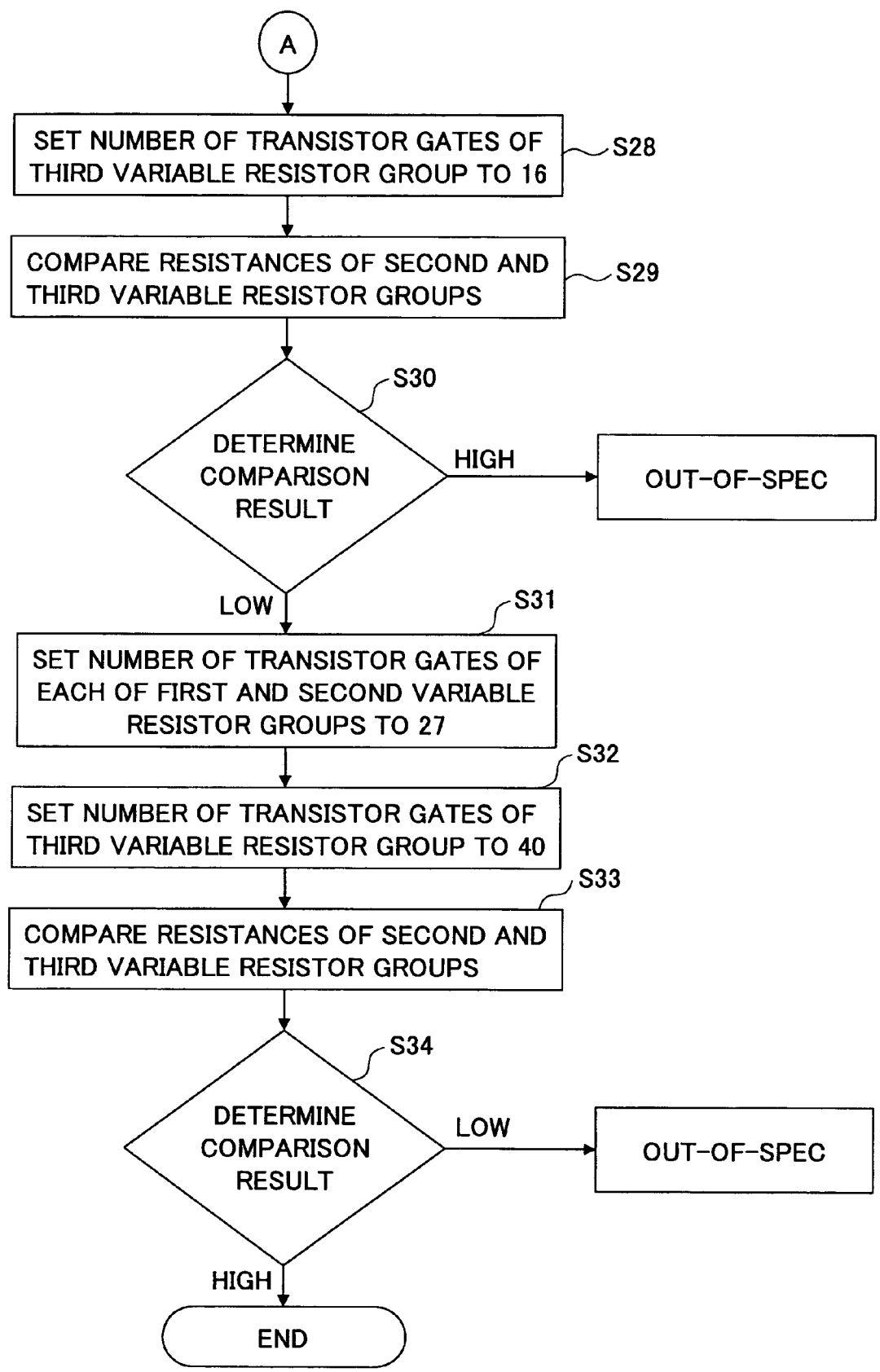

FIG. 11A and FIG. 11B are operational flowcharts of a test for verifying that the transistors of each of the parallel circuits of the first through third variable resistor groups 30-1 through 30-3 can realize the resistance of the reference resistor 400.

In step S21 of FIG. 11A, the number of transistor gates of the first variable resistor group 30-1 is set to 20, which corresponds to 20 parallel transistors. This setting is provided by changing the control signals NDRVNA0 through NDRVNA5 provided to the first variable resistor group 30-1 using the counter 42 and the register (N) 11 as described above. Next, in step S22, the resistance of the first variable resistor group 30-1 and the resistance of the reference resistor 400 are compared in the first comparator circuit 35. As a result, if it is determined in step S23 that the output of the first comparator circuit 35 is LOW level, that is, the resistance of the first variable resistor group 30-1 is lower, the LSI circuit is determined as out-of-spec. On the other hand, if the output of the first comparator circuit 35 is HIGH level, that is, the resistance of the first variable resistor group 30-1 is higher, in step S24, the number of transistor gates of the first variable resistor group 30-1 is set to 27, which corresponds to 27 parallel transistors. Then, the resistances are compared in the first comparator circuit 35 as described above. As a result, if it is determined in step S26 that the output of the first comparator circuit 35 is HIGH level, that is, the resistance of the first variable resistor group 30-1 is higher, the LSI circuit is determined as out-of-spec. On the other hand, if the output of the first comparator circuit 35 is LOW level, that is, the resistance of the first variable resistor group 30-1 is lower, the operation proceeds to step S27.

In step S27, the number of transistor gates of each of the first and second variable resistor groups 30-1 and 30-2 is set to 20, which corresponds to 20 parallel transistors. Then, in step S28 of FIG. 11B, the number of transistor gates of the third variable resistor group 30-3 is set to 16, which corresponds to 16 parallel transistors. Next, in step S29, the resistances of the second and third variable resistor groups 30-2 and 30-3 are compared in the second comparator circuit 34. As a result, if it is determined in step S30 that the output of the second comparator circuit 34 is HIGH level, that is, the resistance of the third variable resistor group 30-3 is lower, the LSI circuit is determined as out-of-spec. On the other hand, if the output of the second comparator circuit 34 is LOW level, that is, the resistance of the third variable resistor group 30-3 is higher, in step S31, the number of transistor gates of each of the first and second variable resistor groups 30-1 and 30-2 is set to 27, which corresponds to 27 parallel transistors. Then, in step S32, the number of transistor gates of the third variable resistor groups 30-3 is set to 40, which corresponds to 40 parallel transistors. Then, the resistances are compared in the second comparator circuit 34 as described above.

As a result, if it is determined in step S34 that the output of the second comparator circuit 34 is LOW level, that is, the resistance of the third variable resistor group 30-3 is higher, the LSI circuit is determined as out-of-spec. On the other hand, if the output of the second comparator circuit 34 is HIGH level, that is, the resistance of the third variable resistor group 30-3 is lower, this operation ends. In this case, it is determined that the LSI circuit is standardized at least with respect to the resistances of the first through third variable resistor groups 30-1 through 30-3 in the ODT control circuit 300.

The test method thus described with reference to FIG. 11 can be implemented by causing a computer to execute the method, using a program including instructions for causing the computer to execute the method. In this case, an interface for inputting test data (that is, resistance setting control signals) from the computer to an LSI circuit to be tested and transmitting comparison results (the outputs of the first and second comparator circuits 35 and 34) from the LSI circuit to the computer is required. The program in this case is loaded into the computer via a portable recording medium such as a CD-ROM or a communications network such as the Internet.

There is also a risk in the above-described test that the method thus digitizing a control method and including the process of averaging control signals may require more time before stabilization of resistance than the conventional analog method. However, according to this embodiment, the ODT circuit 200 and the ODT control circuit 300 are configured independent of each other as shown in FIG. 4, so that it is possible to control resistance setting signals directly from outside. By thus externally providing resistance setting signals, it is possible to conduct the above-described test quickly without increasing test time.

Thus, according to the ODT circuit method of the present invention, it is possible to realize a termination resistor (ODT) circuit significantly improved in noise immunity without increasing the number of reference resistor terminals and chip size. Further, it is also possible to prevent an increase in time required for testing an ODT control circuit for realizing the ODT circuit method.

According to the present invention, a realized resistance is determined by the selection of semiconductor devices or elements to be combined. Therefore, no analog elements are included in resistance realization. Accordingly, the resistance of a termination resistor can be adjusted or controlled with accuracy without being affected by noise. As a result, it is possible to ensure that the same resistance as a desired resistance can be realized as the resistance of the termination resistor, so that it is possible to realize high-speed, accurate data transfer between semiconductor devices or circuits easily.

The present invention is not limited to the specifically disclosed embodiments, and variations and modifications may be made without departing from the scope of the present invention.

The present application is based on Japanese Priority Patent Application No. 2004-250781, filed on Aug. 30, 2004, the entire contents of which are hereby incorporated by reference.

What is claimed is:

1. A method for compensating for semiconductor device resistance, comprising the step of:
    (a) realizing a resistance equal to a desired resistance by one of combinations of a plurality of semiconductor devices, wherein the plurality of semiconductor devices comprise a combination of a plurality of pairs of first and second semiconductor devices of differential channel types,
    said step (a) including the step of (b) sequentially selecting two or more of the semiconductor devices to be combined, and thereby sequentially changing a resistance realized by the selected two or more of the semiconductor devices to be combined;
    (c) realizing the resistance equal to the desired resistance by one of combinations of a plurality of third semiconductor devices for comparison corresponding to and having the same channel type as the first semiconductor devices;
    (d) determining one of combinations of a plurality of fourth semiconductor devices for comparison having the same channel type as the first semiconductor devices based on information on the one of the combinations of the third semiconductor devices for comparison obtained in said step (c);
    (e) realizing a resistance equal to a resistance realized by the determined one of the combinations of the fourth semiconductor devices for comparison by one of combinations of a plurality of fifth semiconductor devices for comparison corresponding to and having the same channel type as the second semiconductor devices;
    (f) determining one of combinations of the first semiconductor devices based on information on the one of the combinations of the fourth semiconductor devices for comparison; and
    (g) determining one of combinations of the second semiconductor devices based on information on the one of the combinations of the fifth semiconductor devices for comparison.

2. The method as claimed in claim 1, further comprising the steps of:
    (c) realizing the resistance equal to the desired resistance by one of combinations of a plurality of semiconductor devices for comparison provided separately from the semiconductor devices recited in claim 1; and (d) determining the one of the combinations of the semiconductor devices recited in claim 1 using information on the one of the combinations of the semiconductor devices for comparison realizing the resistance equal to the desired resistance obtained in said step (c).

3. The method as claimed in claim 2, wherein said step (d) comprises the step of (e) averaging the information on the one of the combinations of the semiconductor devices for comparison obtained by performing said step (c) a plurality of times, and determining the one of the combinations of the semiconductor devices recited in claim 1 based on the averaged information.

4. The method as claimed in claim 1, further comprising the step of (c) updating the two or more of the semiconductor devices to be combined with a counter updated by a predetermined clock.

5. The method as claimed in claim 4, wherein a frequency of the predetermined clock is set to be sufficiently lower than a frequency of an operation clock of a circuit to which the resistance realized by the one of the combinations of the semiconductor devices recited in claim 1 is applied.

6. A circuit having a resistance compensation function, comprising:

a resistance realization part configured to realize a resistance equal to a desired resistance by one of combinations of a plurality of semiconductor devices, wherein the plurality of semiconductor devices comprise a combination of a plurality of pairs of first and second semiconductor devices of differential channel types, wherein the resistance realization part performs an operation of sequentially selecting two or more of the semiconductor devices to be combined, and thereby sequentially changing a resistance realized by the selected two or more of the semiconductor devices to be combined;

a first part configured to realize the resistance equal to the desired resistance by one of combinations of a plurality of third semiconductor devices for comparison corresponding to and having the same channel type as the first semiconductor devices;

a second part configured to determine one of combinations of a plurality of fourth semiconductor devices for comparison having the same channel type as the first semiconductor devices based on information on the one of the combinations of the third semiconductor devices for comparison obtained in the first part;

a third part configured to realize a resistance equal to a resistance realized by the determined one of the combinations of the fourth semiconductor devices for comparison by one of combinations of a plurality of fifth semiconductor devices for comparison corresponding to and having the same channel type as the second semiconductor devices;

a fourth part configured to determine one of combinations of the first semiconductor devices based on information on the one of the combinations of the fourth semiconductor devices for comparison; and a fifth part configured to determine one of combinations of the second semiconductor devices based on information on the one of the combinations of the fifth semiconductor devices for comparison.

7. The circuit as claimed in claim 6, further comprising:

a first part configured to realize the resistance equal to the desired resistance by one of combinations of a plurality of semiconductor devices for comparison provided separately from the semiconductor devices recited in claim 6; and a second part configured to determine the one of the combinations of the semiconductor devices recited in claim 6 using information on the one of the combinations of the semiconductor devices for comparison realizing the resistance equal to the desired resistance obtained in the first part.

8. The circuit as claimed in claim 7, wherein the second part comprises an averaging part configured to average the information on the one of the combinations of the semiconductor devices for comparison obtained by the first part performing the operation of realizing the resistance equal to the desired resistance by the one of the combinations of the semiconductor devices for comparison a plurality of times, and determines the one of the combinations of the semiconductor devices recited in claim 6 based on the averaged information.

9. The circuit as claimed in claim 6, further comprising a counter configured to update the two or more of the semiconductor devices to be combined based on a predetermined clock.

10. The circuit as claimed in claim 9, wherein a frequency of the predetermined clock is set to be sufficiently lower than a frequency of an operation clock of a circuit to which the resistance realized by the one of the combinations of the semiconductor devices recited in claim 6 is applied.

11. A computer-readable recording medium storing a program for causing a computer to control processing for compensating for semiconductor device resistance, the program comprising instructions for causing the computer to execute the step of:

(a) realizing a resistance equal to a desired resistance by one of combinations of a plurality of semiconductor devices, wherein the plurality of semiconductor devices comprise a combination of a plurality of pairs of first and second semiconductor devices of differential channel types, said step (a) including the step of (b) sequentially selecting two or more of the semiconductor devices to be combined, and thereby sequentially changing a resistance realized by the selected two or more of the semiconductor devices to be combined;

(c) realizing the resistance equal to the desired resistance by one of combinations of a plurality of third semiconductor devices for comparison corresponding to and having the same channel type as the first semiconductor devices;

(d) determining one of combinations of a plurality of fourth semiconductor devices for comparison having the same channel type as the first semiconductor devices based on information on the one of the combinations of the third semiconductor devices for comparison obtained in said step (c);

(e) realizing a resistance equal to a resistance realized by the determined one of the combinations of the fourth semiconductor devices for comparison by one of combinations of a plurality of fifth semiconductor devices for comparison corresponding to and having the same channel type as the second semiconductor devices;

(f) determining one of combinations of the first semiconductor devices based on information on the one of the combinations of the fourth semiconductor devices for comparison; and (g) determining one of combinations of the second semiconductor devices based on information on the one of the combinations of the fifth semiconductor devices for comparison.

12. The computer-readable recording medium as claimed in claim 11, wherein the program further comprises instructions for causing the computer to execute the steps of:
(c) realizing the resistance equal to the desired resistance by one of combinations of a plurality of semiconductor devices for comparison provided separately from the semiconductor devices recited in claim 11; and
(d) determining the one of the combinations of the semiconductor devices recited in claim 11 using information on the one of the combinations of the semiconductor devices for comparison realizing the resistance equal to the desired resistance obtained in said step (c).

13. The computer-readable recording medium as claimed in claim 12, wherein said step (d) comprises the step of (e) averaging the information on the one of the combinations of the semiconductor devices for comparison obtained by performing said step (c) a plurality of times, and determining the one of the combinations of the semiconductor devices recited in claim 11 based on the averaged information.

14. A method for testing a circuit including a resistance realization part configured to realize a resistance equal to a desired resistance by one of combinations of a plurality of semiconductor devices, wherein the plurality of semiconductor devices comprise a combination of a plurality of pairs of first and second semiconductor devices of differential channel types, the method comprising the step of:
(a) verifying whether a resistance range realizable by the combinations of the semiconductor devices includes the desired resistances,
wherein step a comprises the steps of:
(b) determining whether a resistance realized by a predetermined first combination of the first semiconductor devices is higher than the desired resistance, and determining whether a resistance realized by a predetermined second combination of the first semiconductor devices is lower than the desired resistance, the resistance realized by the predetermined second combination being lower than the resistance realized by the predetermined first combination; and
(c) determining whether a resistance realized by a predetermined third combination of the second semiconductor devices for realizing a higher resistance than the predetermined first combination of the first semiconductor devices is higher than the resistance realized by the predetermined first combination, and determining whether a resistance realized by a predetermined fourth combination of the second semiconductor devices for realizing a lower resistance than the predetermined second combination of the first semiconductor devices is lower than the resistance realized by the predetermined second combination.

15. A computer-readable recording medium stonng a program for causing a computer to control testing of a circuit including a resistance realization part configured to realize a resistance equal to a desired resistance by one of combinations of a plurality of semiconductor devices, wherein the plurality of semiconductor devices comprise a combination of a plurality of pairs of first and second semiconductor devices of differential channel types, the program comprising instructions for causing the computer to execute the step of:
(a) verifying whether a resistance range realizable by the combinations of the semiconductor devices includes the desired resistance, said step (a) comprising the steps of:
(b) determining whether a resistance realized by a predetermined first combination of the first semiconductor devices is higher than the desired resistance, and determining whether a resistance realized by a predetermined second combination of the first semiconductor devices is lower than the desired resistance, the resistance realized by the predetermined second combination being lower than the resistance realized by the predetermined first combination; and
(c) determining whether a resistance realized by a predetermined third combination of the second semiconductor devices for realizing a higher resistance than the predetermined first combination of the first semiconductor devices is higher than the resistance realized by the predetermined first combination, and determining whether a resistance realized by a predetermined fourth combination of the second semiconductor devices for realizing a lower resistance than the predetermined second combination of the first semiconductor devices is lower than the resistance realized by the predetermined second combination.

* * * * *